United States Patent [19]

Arnold et al.

[11] Patent Number: 5,023,844
[45] Date of Patent: Jun. 11, 1991

[54] SIX-WAY ACCESS PORTED RAM ARRAY CELL

[75] Inventors: James M. Arnold, Hillsboro; Glenn J. Hinton, Portland, both of Oreg.; Frank S. Smith, Chandler, Ariz.

[73] Assignee: Intel Corporation, Santa Clara, Calif.

[21] Appl. No.: 486,408

[22] Filed: Feb. 28, 1990

[51] Int. Cl.$^5$ ............................................. G11C 13/00
[52] U.S. Cl. ................................ 365/230.05; 365/154; 365/189.01
[58] Field of Search ................... 365/189.01, 154, 185, 365/230.05

[56] References Cited

U.S. PATENT DOCUMENTS 4,819,209  4/1989  Takemae et al. ............... 365/230.05

Primary Examiner—Terrell W. Fears
Attorney, Agent, or Firm—Owen L. Lamb

[57] ABSTRACT

A random access memory cell in a register file having multiple independent read ports and multiple independent write ports that support parallel instruction execution. The RAM cell consumes low power and conforms to a tight layout pitch to meet the needs of the random access memory. A single column line is used, with the storage latch device (M 11, M 12) increased in size to provide for the noise margin loss with reference to the prior art two-column design. A single n-device (M 1) is attached to the opposite side of the cell latch (M 11, M 12) to clear the cell prior to writing zeros into the cell. The registers that are to be written are first cleared in the PH2 of the first clock cycle, with the data written in PH1 of the second clock cycle which writes the ones. The zero bits are also written at this time, but they find a cell that already is in the zero state, having been cleared in PH2 of the first clock cycle.

4 Claims, 2 Drawing Sheets

SIX-WAY ACCESS PORTED RAM ARRAY CELL

CROSS REFERENCE TO RELATED APPLICATIONS

Copending patent application Ser. No. 07/486,407, filed Feb. 28, 1990; entitled "REGISTER SCOREBOARDING EXTENDED TO ALL MULTIPLE-CYCLE OPERATIONS IN A PIPELINED MICROPROCESSOR" filed concurrently herewith and assigned to Intel Corporation.

TECHNICAL FIELD

This invention relates to integrated logic circuits, and more particularly, to a random access memory (RAM) cell.

BACKGROUND ART

Copending application Ser. No. 07/486,407; describes a register file that provides a high performance interface to registers through a multi-ported access structure, allowing four reads and two writes to occur in the same machine cycle on different registers.

Since both register and memory types of instructions are allowed to execute in the same cycle, six possible register requests could be executing. Thus, a 6-port register file design is required to correctly implement these parallel functions.

The RAM design approach of the prior art using true and bar column lines is not desirable because it requires too large a die size. Since the RAM cell must be six-way ported, the true-and-bar-column-lines design would require too much space dedicated only to the metal pitch of the column lines.

It is therefore an object of the present invention to provide a random access memory cell that consumes low power and conforms to a tight layout pitch to meet the needs of a random access memory of a register file having multiple independent read ports and multiple independent write ports that support parallel instruction execution.

SUMMARY OF THE INVENTION

The above object is accomplished in accordance with the invention by providing a single column line cell, with the storage latch device sizes increased to provide for the noise margin loss with reference to the prior art two column cell. The increase in size of the storage latch does not increase the size of the RAM cell, since the cell is still metal pitch limited. Without the second column line on the other side of the latch, writing zeros (negative true column lines high) into the cell is unreliable using the prior art static RAM cell design. This problem is avoided by using a single n-device attached to the opposite side of the cell latch to clear the cell prior to writing zeros into the cell. The registers that are to be written are first cleared in the second phase (PH2) of the first clock cycle, with the data written in the first phase (PH1) of the second clock cycle which writes the ones. The zero bits are also written at this time, but they find a cell that already is in the zero state, having been cleared in PH2 of the first clock cycle.

BRIEF DESCRIPTION OF DRAWINGS

The foregoing and other objects, features, and advantages of the invention will be apparent from the following detailed description of a preferred embodiment of the invention as illustrated in the accompanying drawings wherein.

BEST MODE FOR CARRYING OUT THE INVENTION

Figure 1:
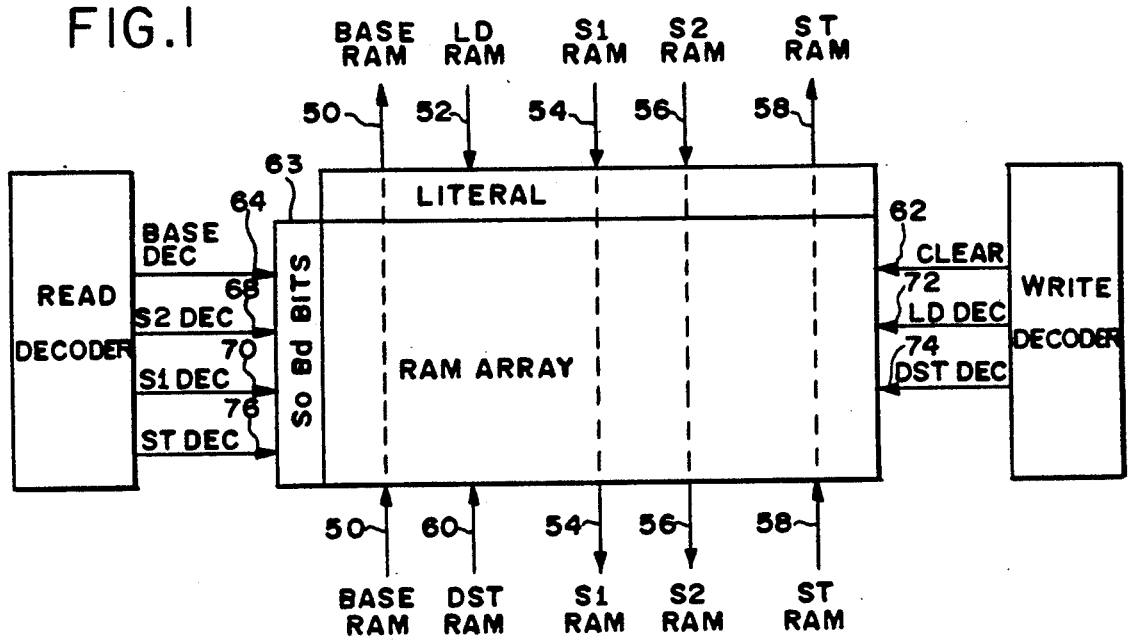
FIG. 1 is a diagram of a random access memory in which the present invention is embodied.

The Ram Array shown in FIG. 1 has 9 rows of 4 registers per row (9×4). Each register is a 32-bit word register. The RAM houses the 36 registers used by the processor. These 36 registers include 16 global registers, 16 frame (local) registers, and 4 microcode scratch registers. The four registers per row are arranged with like word bits grouped together. For example, at the far left the bits coming out of the Ram Array from left to right are Word3 - bit31 Word1 - bit31, Word0 - bit31, Word2 - bit31, and then the next bit, Word3 - bit30, etc. This can be visualized as all four registers stacked one on top of the other, with least significant bits on the same end.

This ordering of the words (3-1-0-2) is done to minimize the RAM cell size. Since Long Words (64-bit) must come only from register pairs 0 and 1 or pairs 2 and 3, the Dst bus, the Src1 bus and the Src2 bus, and Base buses lo, hi will never drive or receive data simultaneously from words 3 and 1, or words 0 and 2. Thus, these ports' column lines can be shared with each other, saving pitch size of the RAM cell.

RAM ARRAY

The Ram Array of FIG. 1 contains the Literal generation logic, the Register Ram Array with address decoders, and the register scoreboard bits as more fully described in copending application Ser. No. 07/486,407;

THE RAM ARRAY CELL

Figure 2:
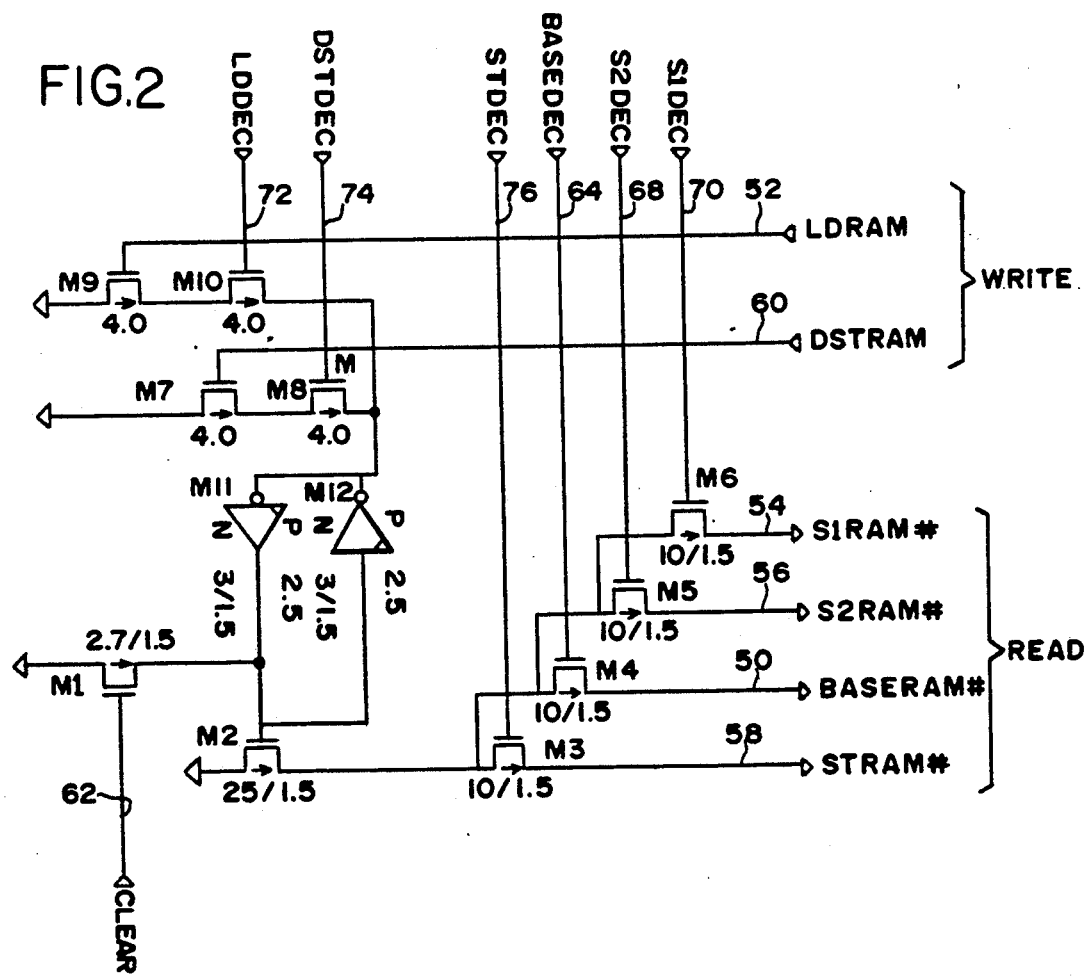
FIG. 2 is a diagram of a multi-ported RAM cell within the RAM of FIG. 1.
Figure 3:
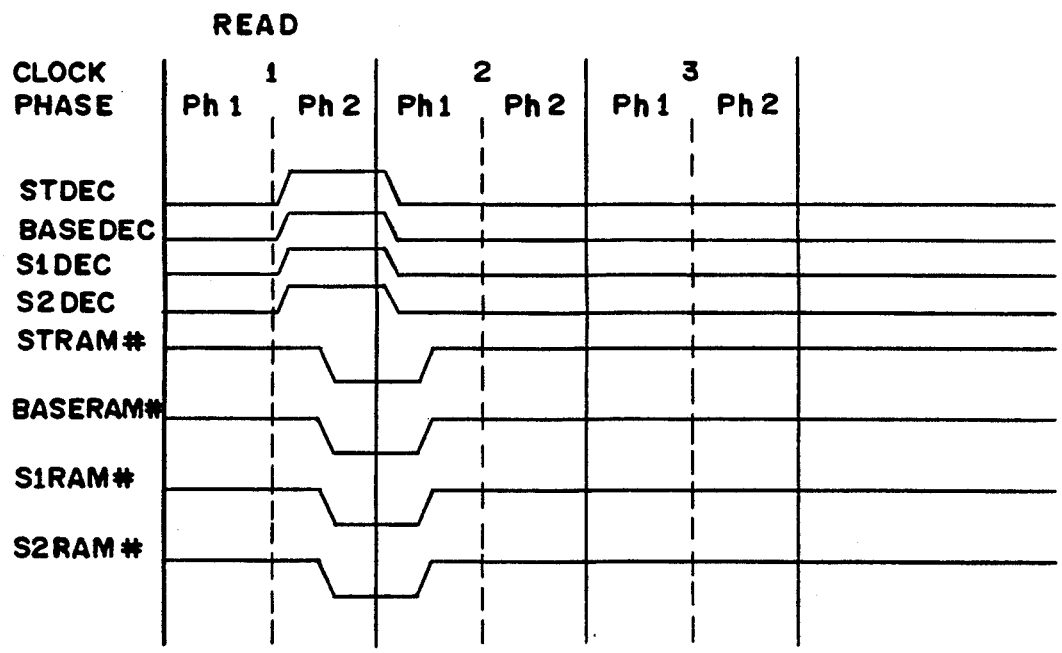
FIG. 3 is a ti diagram of read operations for the circuit shown in FIG. 2.

Prior art RAM cells using true and bar column lines is replaced by a single column line in order to reduce logic size. The storage latch device size is increased to provide for the noise margin loss of the two column design. The increase in size of the storage latch does not increase the size of the RAM cell, since the cell is still metal pitch limited. The RAM cell is shown in FIG. 2.

Figure 4:
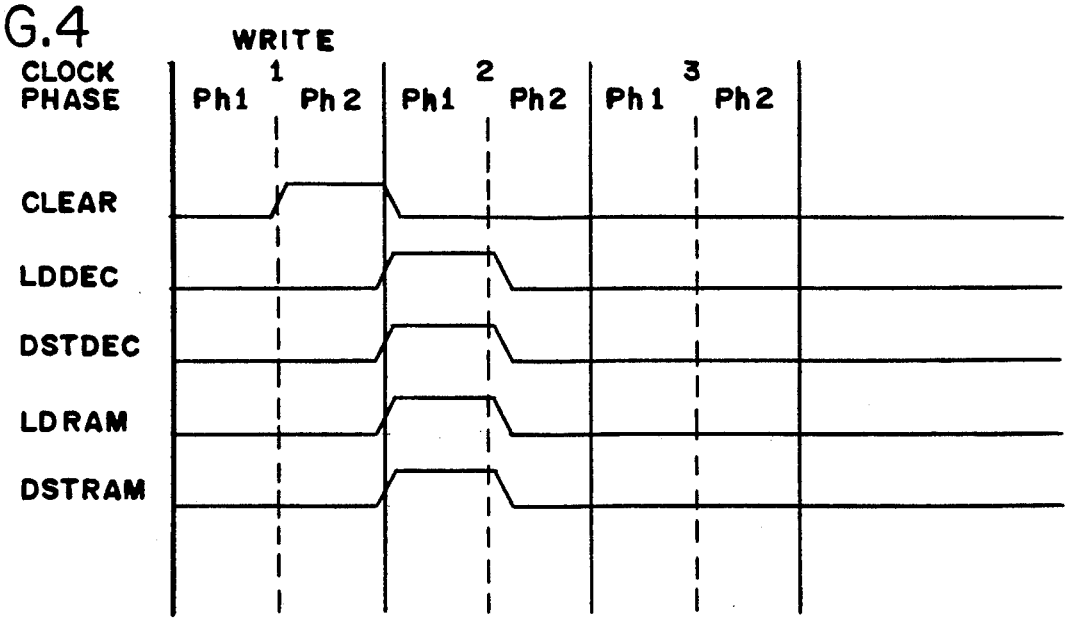
FIG. 4 is a timing diagram of write operations for the circuit shown in FIG. 2.

A single n-device (M 11) is attached to the opposite side of the latch to clear the cell when zeros are to be written. The write timing is shown in FIG. 4. The registers that are to be written are first cleared by asserting the clear line (62) in Phase 2 of the first clock cycle. This sets the cells to zero. The real data is written in Phase 1 of the second clock cycle which writes the ones. The zero bits are also written at this time, but they find an already zeroed cell.

The Ram Array also stores the scoreboard bits which are associated with each register. The use of scoreboard bits is described in copending application Ser. No. 07/486,407; The bit cells are almost identical to the regular RAM cell with one exception. An additional read port is needed for these bits because the destination register's scoreboard bit must be read at the same time as the source register's scoreboard bit to insure that destination updates are performed in the appropriate order. The CLEAR line's additional function with respect to the scoreboard bits is to clear the scoreboard bit when the register is written.

The following lines carry data to and from the RAM:
LDRAM
DSTRAM
S1RAM#
S2RAM#
BASERAM#
STRAM#
Read decoder outputs:
S1DEC
S2DEC
BASEDEC
STDEC
Write decoder outputs:
CLEAR [0:4]—Four clear lines are provided, one for each of the four words per row. The clear line (62) is asserted to clear the appropriate cells prior to writing zeros into the cells. The CLEAR line's additional function with respect to the scoreboard bits (63) is to clear the scoreboard bit when the register is written.

LDDEC
DSTDEC

The circuit of FIG. 2 is driven by a two non-overlapping clock phase of the type described in U.S. Pat. No. 4,816,700 of Michael T. Imel. Four clocks, PH1, PHII, PH2, PH2I, are distributed in the chip. PH1 and PH2 are traditional NMOS non-overlapping clocks with equal duty cycles. PH1I and PH2I are the PMOS analogs to PH1 and PH2 and are exactly inversions of PH1 and PH respectively.

Since both register and memory types of instructions are allowed to execute in the same cycle, six possible register requests could be executing. Thus, a 6-port register file design is required to correctly implement these parallel functions. A mechanism is provided to prevent the collision of data, since writing the same register from multiple sources could be disastrous. To protect against this problem, and to prevent data from being read before it is properly written, the RF uses register scoreboarding. This is described more fully in copending application Ser. No. 07/486,407. which shows the timings for reading and writing the RAM Array, and checking and setting the scoreboard bits when reading and writing the RAM Array.

While the invention has been particularly shown and described with reference to a preferred embodiment thereof, it will be understood by those skilled in the art that the foregoing and other changes in form and detail may be made therein without departing from the scope of the invention.

What is claimed is:

1. For use in a random access memory including a read column address line (76) upon which address information to cause a cell to be read out onto output lines (58) is placed, write address line (72) upon which address information to cause a cell to be written into from an input line (52) is placed, said memory being driven by a clock having a first phase (PH1) and a second phase (PH2) during each successive cycle of said clock comprising:
   an inverter (M 11);
   an inverter (M 12);
   said inverter (M 11) and said inverter (M 12) being connected to each other to thereby form a storage device capable of latching a binary one upon the condition that one of said inverters is conducting and a binary zero upon the condition that the other of said inverters is conducting;
   a clear line (62);
   a first transistor (M 1);
   said first transistor being connected between the output (61) of one of said inverters and a sink (63), the gate of said first transistor being connected to said clear line (62); and,
   a second transistor (M 2), the gate of said second transistor being connected in series with said inverter pair such that current flowing through said inverter pair (M 11, M 12) and said second transistor (M 2) can switch said first transistor (M 1).

2. The combination in accordance with claim 1 further comprising:
   a third transistor (M 3); and,
   a fourth transistor (M 4);
   said third and fourth transistors being connected to said second transistor (M 2) to thereby form an OR of said output lines (50, 58) and said inverter pair (M 11, M 12).

3. The combination in accordance with claim 1 further comprising:
   a fifth transistor (M 7);
   a sixth transistor (M 9); and,
   said fifth and a sixth transistors being connected to said inverter pair to thereby form an OR gate on said row write input lines (52, 60) and said inverter pair, said collectors of said fifth and a sixth transistors being connected to said write input lines such that said write inputs are selectable by a write column address.

4. The combination in accordance with claim 2 further comprising:
   a fifth transistor (M 7);
   a sixth transistor (M 9); and,
   said fifth and a sixth transistors being connected to said inverter pair to thereby form an OR gate on said row write input lines (52, 60) and said inverter pair, said collectors of said fifth and a sixth transistors being connected to said write input lines such that said write inputs are selectable by a write column address.

* * * * *